(12) United States Patent
Youssef

(10) Patent No.: US 7,287,169 B2
(45) Date of Patent: Oct. 23, 2007

(54) ELECTRONIC DEVICE AND TIMER THEREFOR WITH TAMPER EVENT STAMP FEATURES AND RELATED METHODS

(75) Inventor: Tom Youssef, Dallas, TX (US)

(73) Assignee: STMicroelectronics, Inc., Carrollton, TX (US)

( * ) Notice: Subject to any disclaimer, the term of this patent is extended or adjusted under 35 U.S.C. 154(b) by 886 days.

(21) Appl. No.: 10/268,871

(22) Filed: Oct. 10, 2002

(65) Prior Publication Data
US 2004/0073807 A1   Apr. 15, 2004

(51) Int. Cl.
*G06F 11/30* (2006.01)
(52) U.S. Cl. ............ 713/194; 713/320; 713/502; 711/109
(58) Field of Classification Search ......... 713/178, 713/194, 320, 500, 502; 368/188; 340/309.16; 711/200, 109; 235/462.18; 200/19.04
See application file for complete search history.

(56) References Cited

U.S. PATENT DOCUMENTS

| 5,111,487 | A | * | 5/1992 | Burch ............... 377/44 |
| 5,533,727 | A |   | 7/1996 | DeMar ............... 43/23 |
| 6,236,197 | B1 |   | 5/2001 | Holdsclaw et al. ...... 324/110 |
| 6,357,007 | B1 | * | 3/2002 | Cromer et al. ......... 713/194 |
| 6,369,719 | B1 |   | 4/2002 | Tracy et al. .......... 340/870.02 |
| 6,888,472 | B2 | * | 5/2005 | Yoshimura et al. ..... 340/825.22 |
| 7,080,160 | B2 | * | 7/2006 | Cognet et al. ......... 709/248 |

OTHER PUBLICATIONS

STMicroelectronics Product Brochure, *16 Kbit (2kb x8) Timekeeper® SRAM*, Nov. 1998.
STMicroelectronics Product Brochure, *Zeropower and Timekeeper NVRAMs*, 1998.
STMicroelectronics, Inc., *What is a Timekeeper® NVRAM?*, 2002, available at http://us.st.com.

* cited by examiner

*Primary Examiner*—T. B. Truong
(74) *Attorney, Agent, or Firm*—Lisa K. Jorgenson; Christopher F. Regan

(57) ABSTRACT

An electronic timer may include a clock reference signal generator and a real time clock (RTC) circuit for generating real time data based upon the clock reference signal. The RTC circuit may include a plurality of registers each for storing a respective bit of the real time data. Further, each register may include a master latch for initially storing the real time data bit, a slave latch for subsequently storing the real time data bit, and a user latch for storing the real time data bit from the slave latch. The RTC circuit may further include a controller for causing at least some of the registers to increment based upon the clock reference signal. Additionally, the electronic timer may also advantageously include a tamper circuit for receiving a tamper event signal and causing each of the user latches to hold a time stamp therein.

19 Claims, 5 Drawing Sheets

ELECTRONIC DEVICE AND TIMER THEREFOR WITH TAMPER EVENT STAMP FEATURES AND RELATED METHODS

FIELD OF THE INVENTION

The present invention relates to the field of electronic circuits, and, more particularly, to electronic timing circuits and related methods.

BACKGROUND OF THE INVENTION

Metering devices, such as utility meters, are sometimes tampered with by dishonest individuals who wish to avoid paying for the full amount of utilities they use, for example. Furthermore, point-of-sale devices, such as cash registers or vending machines, may also be subject to tampering by thieves, vandals, etc.

Various prior art approaches have been used for detecting and reporting tampering with such devices. By way of example, U.S. Pat. No. 6,236,197 to Holdsclaw et al. is directed to an apparatus for detecting tampering in a multi-phase electric meter. More particularly, this is done by determining the loss of a reference voltage (indicating possible tampering) in a two-element electronic meter. To determine if the reference voltage of the meter in a 3-wire delta or network installation has been lost, a measurement of the phase angle difference between the two phases is made. If the phase difference is equal to a predetermined value, the meter indicates on a display that a loss of reference voltage and possible tampering has taken place. The apparatus may also be adapted to determine a length of time from when the condition occurred so that the appropriate enforcement and/or billing agencies may be informed. In particular, when an abnormal condition is detected by the meter, warnings may be time and date stamped and logged in an event log, and the number of events and cumulative time of the conditions may be separately logged in an occurrence log. The logs are stored in an EEPROM which may be accessed through software for further diagnostic processing and evaluation external to the meter.

Another approach is provided in U.S. Pat. No. 6,357,007 to Cromer et al. This patent discloses a system for monitoring tamper events in a computer system connected to a network. The system includes a tamper real time clock (RTC) which receives a tamper event signal from the computer system. The tamper RTC includes a timer for indicating the time of a tamper event, and a management device for receiving the tamper event signal. The management device issues a command to the tamper RTC to obtain the time of the tamper event. The management device also generates a network packet which includes the time of the tamper event to a system administrator of the network.

Despite the advantages of the above tamper detection approaches, further tamper indication functionality may be required in some applications.

SUMMARY OF THE INVENTION

In view of the foregoing background, it is therefore an object of the present invention to provide an electronic timer with tamper detection features and related methods.

This and other objects, features, and advantages in accordance with the present invention are provided by an electronic timer which may include a clock reference signal generator and a real time clock (RTC) circuit for generating real time data based upon the clock reference signal. The RTC circuit may include a plurality of registers for storing respective bits of the real time data. Further, each register may include a master latch for initially storing a real time data bit, a slave latch for subsequently storing the real time data bit, and a user latch for storing the real time data bit from the slave latch. The RTC circuit may further include a controller for causing at least some of the registers to increment based upon the clock reference signal.

Additionally, the electronic timer may also advantageously include a tamper circuit for receiving a tamper event signal and causing the user latches to hold current real time data bits based thereon until the tamper circuit is reset by a user. As such, the user latches thus provide user accessible real time data when the tamper event signal does not indicate the tamper event has occurred, and also provide a user accessible time stamp when the tamper event signal does indicate the tamper event has occurred.

By way of example, the electronic timer may advantageously be used in a point-of-sale device, such as a cash register, to provide a real time clock output during normal operation that remains fixed once tampering with the device is detected (e.g., an unauthorized opening of the cash drawer, etc.). The electronic timer may similarly be used for utility meters, such as electric and water meters, for example, to provide a ready and accurate indication as to when a tampering event occurs.

More particularly, the electronic timer may advantageously be implemented in an integrated circuit and include a package therefor. Further, the package may have external connection terminals thereon, and the electronic device may also include a backup battery that is removably connectable to the package and external connection terminals. Moreover, the clock reference signal generator may be an oscillator, for example, and the electronic timer may also include a crystal for cooperating with the oscillator to generate the clock reference signal.

In addition, the crystal may be removably connectable to the package and external connection terminals, as with the backup battery. In fact, in some embodiments both the crystal and backup battery may advantageously be mounted in a "hat" type package which snaps onto the integrated circuit package, thus allowing for easy replacement without the need to remove the entire electronic timer from the electronic device.

The electronic timer may also include a random access memory (RAM) connected to the RTC circuit for storing real time data. An interface circuit may also be connected to the RTC circuit for allowing a user to access the user latches. The interface circuit may further allow user write access to the plurality of registers for writing initial time data therein.

Further, a supply voltage detection circuit may also be included for selectively connecting the backup battery to the clock reference signal generator, the RTC circuit, and the tamper circuit based upon a supply voltage falling below a first supply threshold. A battery voltage detection circuit may also be included for providing a low battery voltage indication when the voltage of the backup battery falls below a low battery threshold. An additional supply voltage detection circuit may also be included for prohibiting user access to the user latches when a supply voltage falls below a second supply threshold.

An electronic device is also provided in accordance with the present invention which may include a housing, a tamper sensor carried by the housing for detecting tampering with the electronic device and generating a tamper event signal based thereon, and an electronic timer, such as the one described briefly above, connected to the tamper sensor. As noted above, the electronic device may be a utility meter, such as an electric or water meter, for example, including at least one connector carried by the housing for connecting the electronic device to a utility supply line (e.g., a water or electric supply line). Thus, the electronic device may also include a metering device carried by the housing for measuring a quantity of the utility passing through the utility supply line. Alternately, the electronic device may be a point-of-sale device, such as a cash register, and include a processor carried by the housing for processing sales data.

A security method aspect of the invention is for determining the time of tampering with an electronic device and may include generating a clock reference signal and generating real time data based upon the clock reference signal. Generation of the real time data may include storing respective bits of the real time data in a plurality of registers, where each register may include a master latch for initially storing the real time data bit, a slave latch for subsequently storing the real time data bit, and a user latch for storing the real time data bit from the slave latch. Further, the registers may be incremented based upon the clock reference signal. The method may further include holding a current real time data bit in each of the user latches based upon a tamper event signal indicating tampering with the electronic device, and resuming storing real time data in the user latches based upon the tamper event signal being reset.

DETAILED DESCRIPTION OF THE PREFERRED EMBODIMENTS

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout, and prime notation is used to indicate similar element in alternate embodiments.

Figure 1:
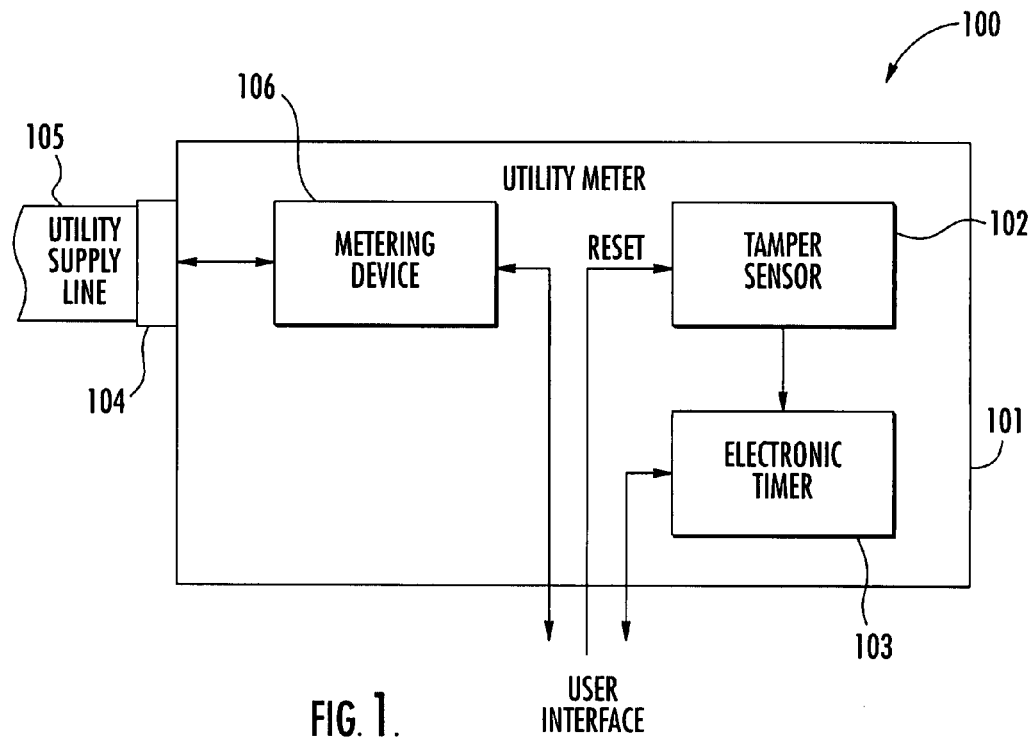
FIG. 1 is a schematic block diagram of a first electronic device in accordance with the present invention.

Referring initially to FIG. 1, an electronic device, namely a utility meter 100, in accordance with the present invention illustratively includes a housing 101 and a tamper sensor 102 carried by the housing. The tamper sensor 102 is for detecting tampering with the utility meter 100 and generating a tamper event signal based thereon. The utility meter 100 further includes an electronic timer 103 connected to the tamper sensor. The housing 101 may be a cover for the utility meter 100, and the tamper sensor 102 may be a switch for detecting when the cover is opened, for example. Of course, other types of tamper sensors 102 known to those skilled in the art may also be used and are contemplated by the present invention. The utility meter 100 further illustratively includes one or more connectors 104 for connecting the meter to a utility supply line 105, and a metering device 106 for measuring the quantity of utilities being consumed via the supply line, as will be appreciated by those of skill in the art.

In accordance with the present invention, the electronic timer 103 advantageously provides user accessible real time data when the tamper event signal does not indicate tampering has occurred, and further provides a user accessible time stamp when the tamper event signal does indicate tampering has occurred, as will be explained further below. Accordingly, a user (e.g., a utility company) will know precisely when its meter was tampered with and may thus determine when meter readings became unreliable, for example. If the meter is in a location monitored by security cameras, the time stamp could advantageously be used to help find the exact tape, location, etc. where the tampering event was recorded, without having to sort through hours or even days worth of footage.

Figure 2:
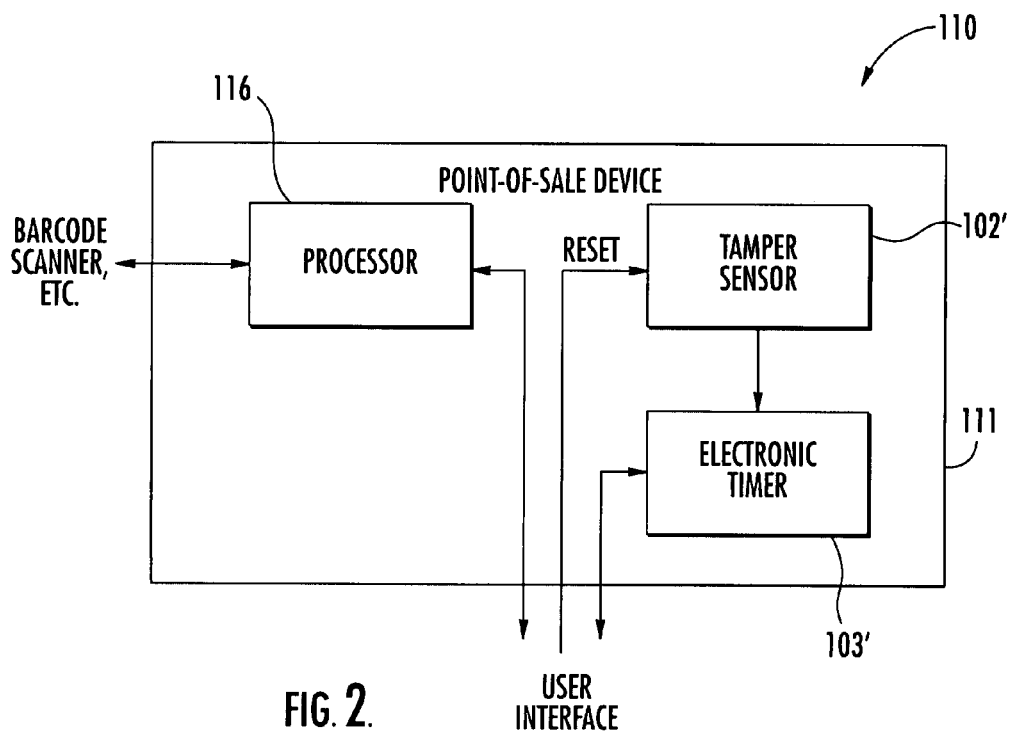
FIG. 2 is a schematic device of a second electronic device in accordance with the present invention.

An electronic point-of-sale device 110, such as a cash register, for example, in accordance with the present invention is illustratively shown in FIG. 2. Again, the point-of-sale device may also include a housing 111 (such as a cover) along with a tamper sensor 102' and electronic timer 103'. A processor 116 is also included in the point-of-sale device 110 for processing sales data. More particularly, the processor 116 may be connected to a barcode scanner, etc., for reading identifying indicia of products being purchased, and the processor may then retrieve sales data such as price, etc., from a database and tally and/or report this data, as will be appreciated by those of skill in the art.

Here again, the electronic timer 103' will provide user accessible real time data when the tamper event signal does not indicate tampering has occurred, and further provide a user accessible time stamp when the tamper event signal does indicate tampering has occurred. Accordingly, the electronic timer 103' may be used to provide a real time clock output (e.g., via a liquid crystal (LCD) (not shown)) during normal operation which remains fixed once tampering with the device is detected (e.g., an unauthorized opening of the cash drawer, etc.). Of course, the electronic timer 103, 103' may be used in numerous other applications as well (e.g., computers, vending machines, etc.), as will be appreciated by those of skill in the art.

Figure 3:
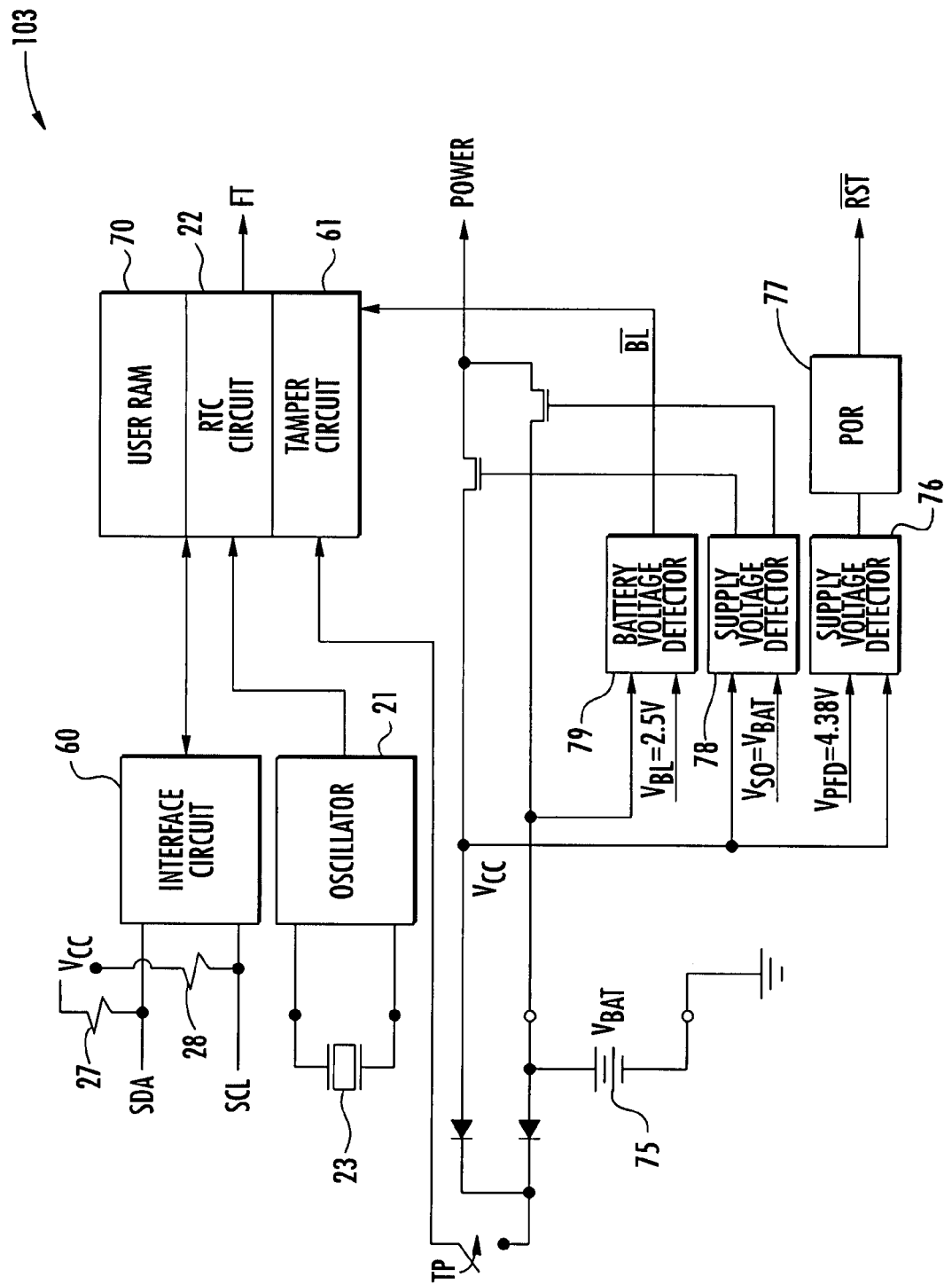
FIG. 3 is a schematic circuit diagram of an electronic timer of the electronic device of FIG. 1.
Figure 4:
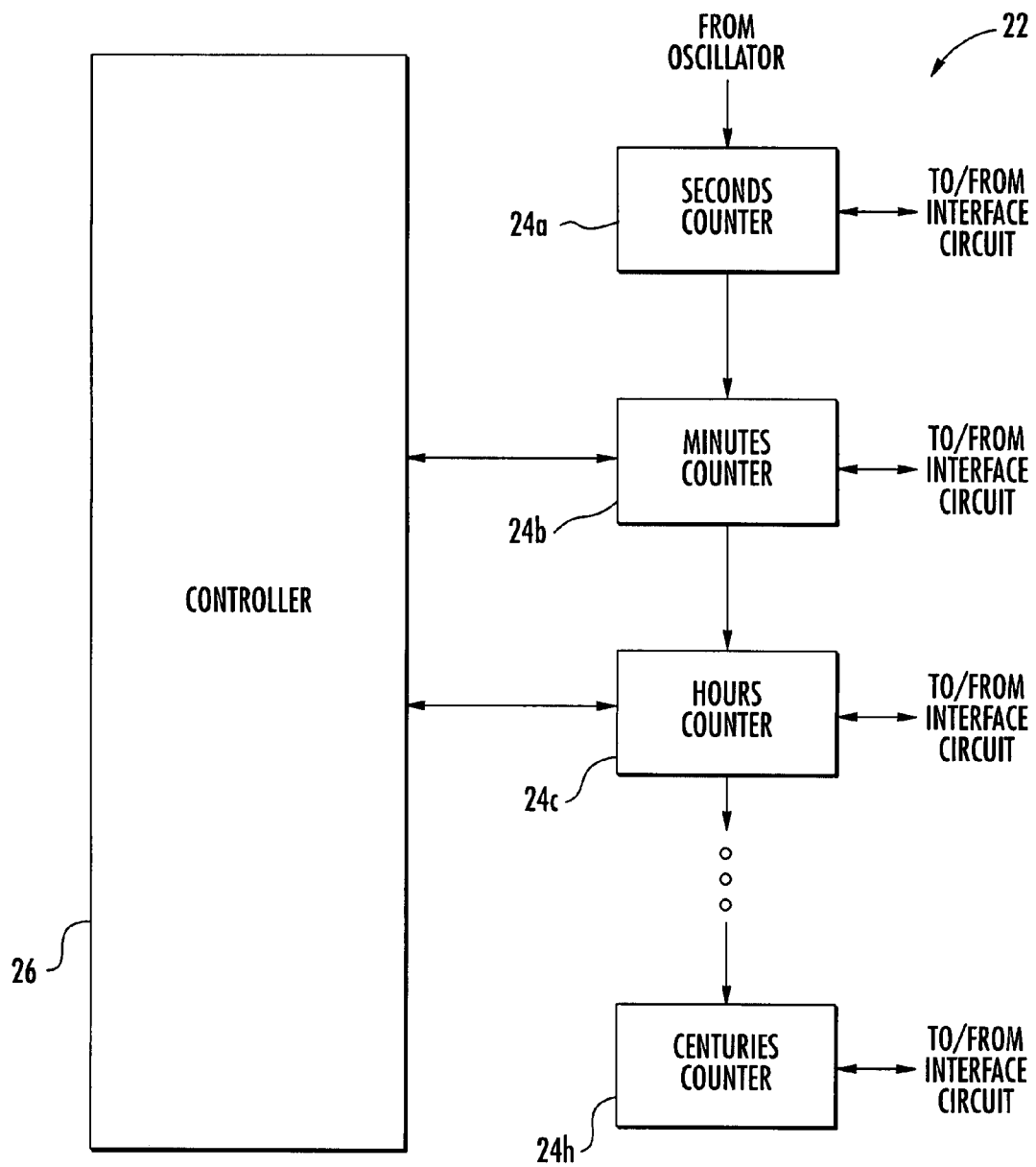
FIG. 4 is a schematic circuit diagram illustrating in greater detail the RTC circuit of the electronic timer of FIG. 3.

Referring now to FIGS. 3-4, the electronic timer 103 in accordance with the present invention illustratively includes a clock reference signal generator, such as the oscillator 21, and a real time clock (RTC) circuit 22 for generating real time data based upon a clock reference signal from the oscillator. By way of example, the oscillator 21 may cooperate with a crystal 23 to generate the clock reference signal, as will be appreciated by those of skill in the art. In particular, a crystal/oscillator combination may be used to provide a substantially constant 32.768 KHz clock reference signal, which may then readily be converted to a 1 Hz signal for use in keeping real time.

To do so, the RTC circuit 22 illustratively includes a plurality of counters 24a-24h which successively generate time data (e.g., seconds, minutes, hours, days, months, years, and centuries) based upon the clock reference signal. That is, a seconds counter 24a first receives the 32.768 KHz clock reference signal from the oscillator 21. The seconds counter 24a includes fifteen one-bit registers 25 (FIG. 5), which thus provide a total count of 32,768 (i.e., $2^{15}$), as will be appreciated by those skilled in the art. As such, the seconds counter 24a will provide a rollover or carry bit once every second based upon the clock reference signal, which is in turn used by the minutes counter 24b for counting minutes. This process continues through to a centuries counter 24h, which counts the current century. The counters 24a-24h are thus continuously updated with respective real time data units therein.

Of course, it will be appreciated that the various units of time noted above do not exactly correspond to powers of two, the number of days in successive months are often different, and leap years need to be accurately accounted for as well. As such, the RTC circuit also illustratively includes a controller 26 which cooperates with the counters 24b-24g to ensure that the carry over signal to a next register occurs at the correct count for the particular unit of time being counted.

Thus, for example, while the minutes counter 24b will necessarily include at least six binary registers to count the 60 seconds in a minute (i.e., since $2^6=64$), the controller 26 ensures that the carry over to the hours counter 24c occurs when the minutes counter is incremented to 61, not when the minutes counter exceeds its maximum count value (e.g., 64, 128, etc.). The controller 26 may be implemented using various circuitry, such as comparators, for example, as will be readily appreciated by those skilled in the art.

Of course, alternate counter arrangements may also be used as contemplated by the present invention. For example, the clock reference signal may be of any convenient frequency, and the size of the seconds counter 24a may be adjusted accordingly. In the example described above, the seconds counter 24a will provide a carry signal with a frequency of 1 Hz, so there is no need for the seconds counter to cooperate with the controller 26, but this could be done if the clock reference signal frequency does not correspond to an exact power of two. Further, a single counter could be used in place of the years and centuries counters 24g, 24h noted above, if desired, as will be appreciated by those of skill in the art.

Figure 5:
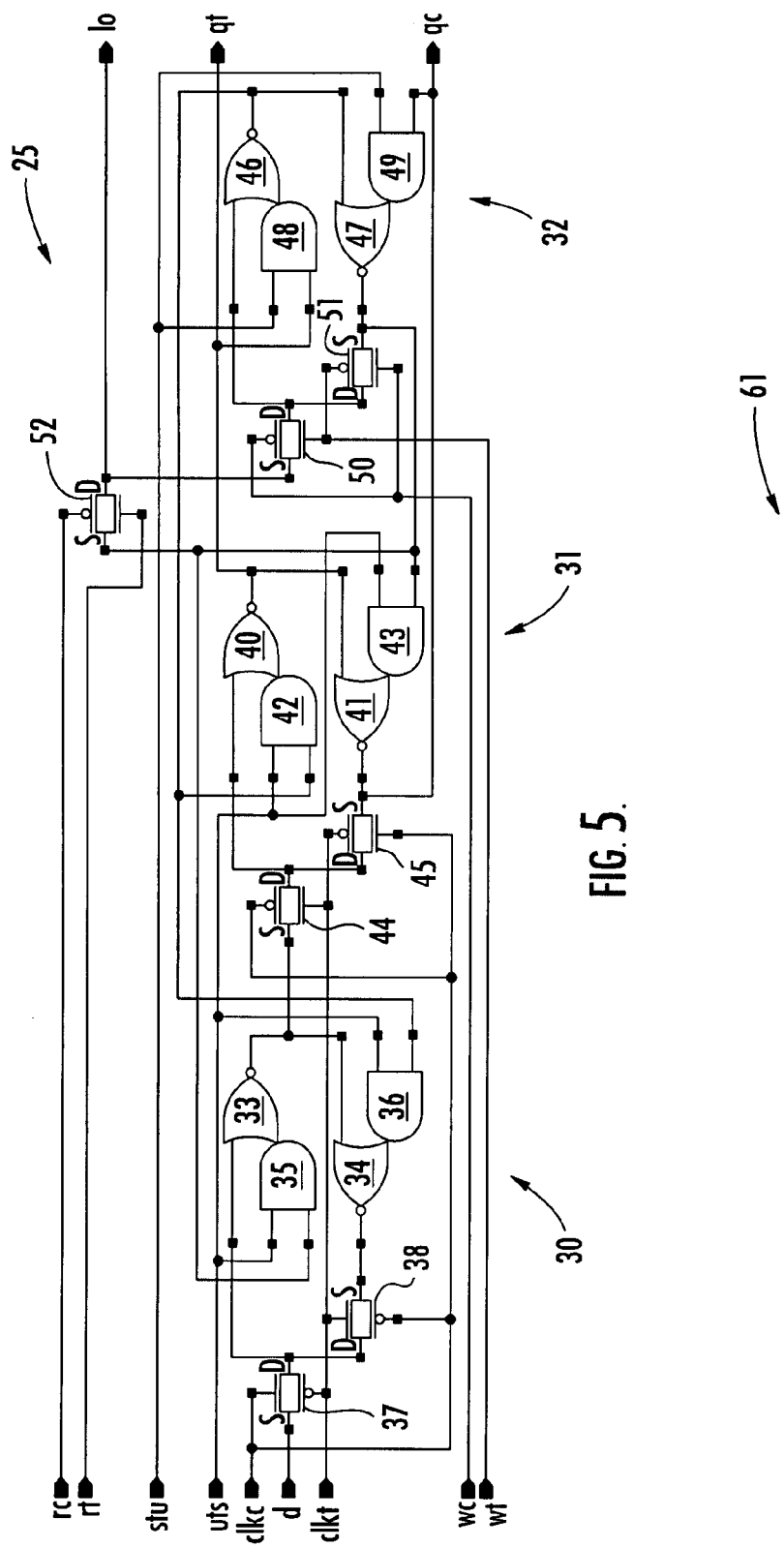
FIG. 5 is a schematic circuit diagram illustrating in grater detail a portion of a counter of the RTC circuit of FIG. 4.

An exemplary embodiment of a register 25 is illustrated in FIG. 5. As noted above, each of the counters 24a-24h includes a plurality of the registers 25, and the minimum number thereof will vary depending upon the particular time unit being counted in a given register. Of course, counters 24a-24h with different numbers of registers 25 may be used, or a single type of counter with enough registers to accommodate the largest time unit being counted could be used for each of the counters 24a-24h. In any event, the controller 26 circuitry will require modification as necessary to correspond to the particular counter size used, as will be understood by those skilled in the art.

Each register 25 includes a master latch 30 for initially storing the real time data bit based upon input signals uts, clck, d, and clkt, which may originate from the controller 26 or another register 25, depending upon the particular embodiment and counters 24a-24h in question. In particular, the signal d provides the next real time data bit to be stored in the master and slave latches 30, 31, while the complementary clock signals clkc and clkt control writing of this data bit to the master and slave latches. Moreover, the signal uts disables the real time data updates to the master and slave latches 30, 31 when the electronic timer 103 is placed in a write mode. This is done so that initial time data stored in a user latch 32 by the user can be transferred to the master and slave latches, as will be described further below.

The master latch 30 illustratively includes NOR gates 33, 34 and AND gates 35, 36. Pass gates 37, 38 are also associated with the master latch 30 for providing access thereto. The register 25 further includes a slave latch 31 which subsequently stores the real time data bit previously stored in the master latch 30. The slave latch 31 similarly includes NOR gates 40, 41, AND gates 42, 43, and also has pass gates 44, 45 associated therewith. The master/slave combination thus essentially provides for a binary coded decimal (BCD) counting configuration, as will be appreciated by those of skill in the art.

Moreover, the register 25 also includes the user latch 32 which stores the real time data bit from the slave latch 31. Here again, the user latch 32 similarly includes NOR gates 46, 47, AND gates 48, 49, and also has pass gates 50, 51, 52 associated therewith. The user latches 32 are accessible by a user via an interface circuit 60 (FIG. 3) to obtain the real time data stored therein. In particular, control signals rc, rt and the pass gate 52 control read access to the user latch 32, and control signals wc, wt and the pass gate 50 control write access to the user latch. Further, the signals qt and qc indicate the current data bit stored in the user latch 32 and a next bit to be stored therein, respectively, and these signals may be connected to the controller 26 for setting the next value of the signal d, as will be appreciated by those skilled in the art.

The interface circuit 60 may be an inter-integrated circuit ($I^2C$) bus interface circuit, for example, as will be appreciated by those of skill in the art. More particularly, the interface circuit 60 may communicate with external circuitry via a two-wire bus including a bi-directional data signal SDA and a clock signal SCL, which may be connected to Vcc via respective pull-up resistors 27, 28 in some embodiments, if required. Of course, other suitable interface circuitry may also be used. In addition to providing read access, the interface circuit 60 also allows user write access to the plurality of registers for writing initial time data therein, which provides the starting time for the RTC circuit 22. In particular, the signal bus io is used for transferring data between the user and the user register 25 via the interface circuit 60.

Figure 6:
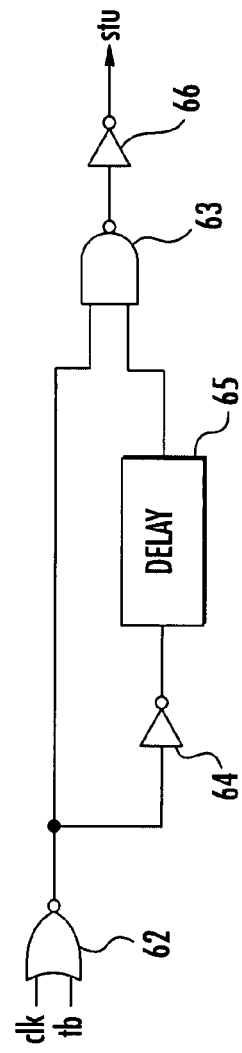
FIG. 6 is a schematic circuit diagram illustrating in greater detail the tamper circuit of the electronic timer of FIG. 3.

In accordance with the present invention, the electronic timer 130 also includes a tamper circuit 61 for receiving a tamper event signal tb (FIG. 6) and causing each of the user latches 32 to hold a current real time data bit until the tamper circuit is reset by a user. As such, the user latches 32 thus provide user accessible real time data when the tamper event signal tb does not indicate a tamper event has occurred, but also provide a user accessible time stamp when the tamper event signal does indicate a tamper event has occurred.

By way of example, when the tamper sensor 102, 102' is activated, a tamper pin or input TP (FIG. 3) receives the tamper event signal tb, which is provided to the tamper circuit 61. In other words, activation of the tamper sensor 102, 102' sets the tamper event signal or bit tb to a predetermined logic level indicative of a tamper event. Of course, various other methods and devices for detecting tamper events are contemplated by the present invention and will be understood by those of skill in the art, as noted above.

The tamper event signal tb is input to a NOR gate 62, along with a clock signal clk, such as a 125 μs pulse occurring once per second, for example. Other suitable clock values may also be used. A output of the NOR gate 62 is received by a first input of a NAND gate 63. A second input of the NAND gate 63 is also connected to the output of the NOR gate 62 via a delay path including an inverter 64 and a delay element 65. The delay path thus causes the output of the NAND gate 63 to have a predetermined duration equivalent to that of the delay path, as will be appreciated by those of skill in the art. By way of example, a suitable delay time may be about 20 ns or more, though other delay times may also be used. The output of the NAND gate 63 is connected to a downstream inverter 66, which provides an output signal stu to the registers 25. The user latches 32 store the time stamp corresponding to the time of the tamper event based upon the output signal stu being activated.

In the illustrated example, during normal operation the signal tb is low, and the signal clk will pulse high once per second, as noted above. As the signal clk transitions from a high to a low level, the signal stu will pulse high and cause the data stored in the slave latch 31 to be transferred to the user latch 32. When a tamper event occurs, the signal tb goes high and forces the signal stu to remain low regardless of the level of the signal clk. Since the signal stu remains low, the data transfer from the slave latch 31 to the user latch 32 no longer occurs. Thus, the user latch 32 will have stored therein the exact time when the tamper event occurred. The signal tb will remain high until cleared by the user. When this is done, current real time data will then again be written in the user latch 32.

The electronic timer 130 may optionally include a random access memory (RAM) 70 (FIG. 1) connected to the RTC circuit 22 for storing real time or other data. If the RAM 70 is included, the user latches 32 may be mapped into the available RAM addresses. That is, several bytes of the RAM 70 are replaced by the user latches 32 such that the time data is conveniently read and written just like RAM locations, as will be appreciated by those of skill in the art.

Figure 7:
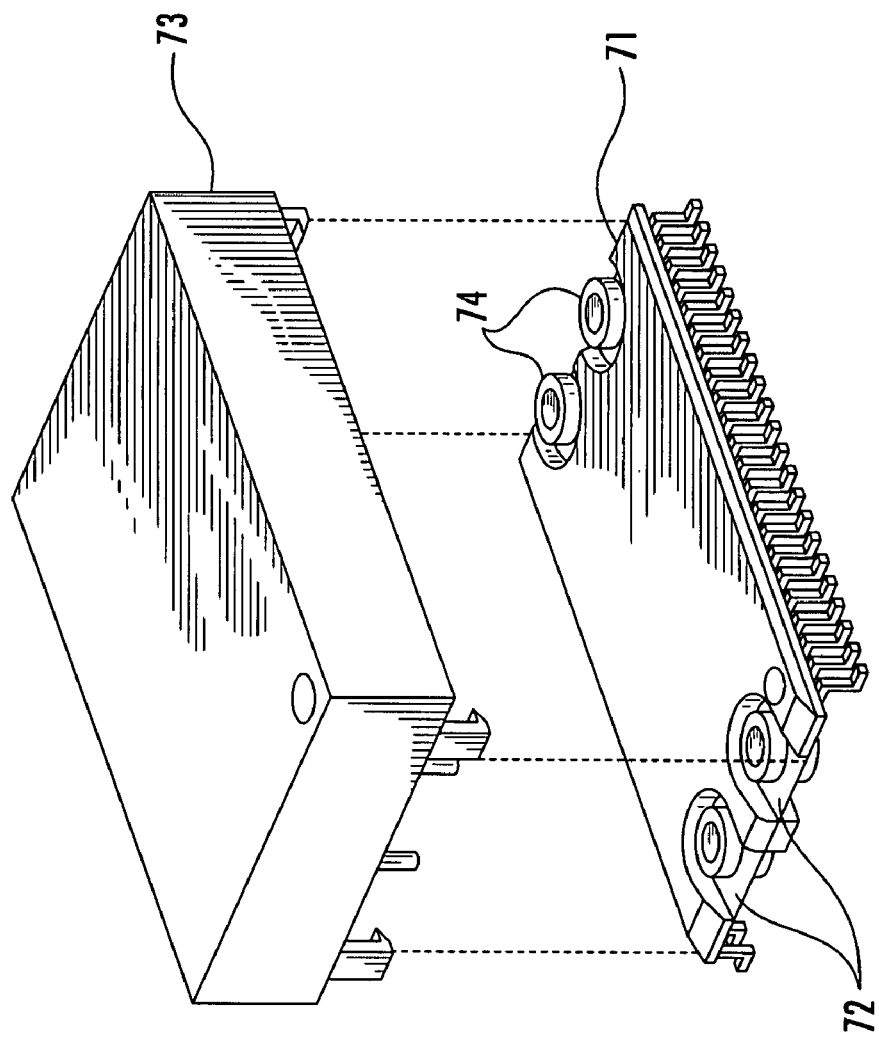
FIG. 7 is an exploded perspective view of a package for the electronic timer of FIG. 3 when implemented as an integrated circuit and with a backup battery and crystal to be connected thereto.

In one particularly advantageous embodiment now described with additional reference to FIG. 7, the electronic timer 130 may advantageously be implemented in an integrated circuit to be housed within a package 71. As illustratively shown, the package 71 is a small outline integrated circuit (SOIC) package, although other package types may also be used. Further, the package 71 has external battery connection terminals 72 thereon, and the electronic timer 130 may also include a backup battery 75 (FIG. 3) that is removably connectable to the integrated circuit package and external connection terminals 72.

In particular, the backup battery 75 may advantageously be housed within a snap-on "hat" style package 73. The battery package 73 conveniently snaps onto the package 71 such that battery terminals on the battery package 73 (not shown) contact the external battery connections 72. Moreover, the crystal 23 may also advantageously be included within the battery package 73 such that the terminals of the crystal contact external crystal terminals 74 on the package 71. As such, when it is time to replace the backup battery 75 and/or crystal 23, a new battery package 73 may easily be substituted for the old one without the need to remove the entire electronic timer 130 from the electronic device 100, 110.

Returning again to FIG. 3, the electronic timer 130 also illustratively includes a first supply voltage detection circuit 76 for detecting when the supply voltage (i.e., Vcc) falls below a first threshold $V_{PFD}$. When this occurs, the first supply voltage detection circuit 76 cooperates with a power on reset (POR) circuit 77 to prohibit user access to the RAM 70 and user latches 32. In particular, the user RAM 70 is typically designed to operate within a predetermined voltage range for a given Vcc, e.g., 4.5 to 5.5 V for Vcc=5V. Accordingly, to ensure data integrity, when Vcc drops below $V_{PFD}$, the POR circuit 77 sets the $\overline{RST}$ signal so that access to the RAM 70 and user latches 32 is prohibited.

Similarly, a second supply voltage detection circuit 78 is also illustratively included for detecting when the supply voltage falls below a second supply threshold or battery switch-over voltage $V_{SO}$. That is, when Vcc falls below $V_{SO}$, the second supply voltage detection circuit 78 connects the oscillator 21, the RTC circuit 22, and the tamper circuit 61 to the backup battery 75. Other circuitry may also be connected to the backup battery 75, such as the RAM 70, for example, if desired. Of course, this will cause additional battery drain, so if it is desired to retain data in the RAM 70 during power failures, etc., it may be desirable to implement a "sleep mode" so that the RAM only receives power for a limited duration, as will be appreciated by those of skill in the art. This could be done a predetermined time after switching to the backup battery 75, for example, or when the backup battery voltage falls below another lower threshold.

To facilitate further battery savings, in some embodiments it may also be desirable to selectively disable the oscillator 21. For example, if the electronic timer 130 is going to spend a significant amount of time on the shelf, it will be desirable to turn off the oscillator 21 to minimize current drain on the backup battery 75. To this end, an external signal may be provided to the electronic timer 130 for disabling the oscillator 21 prior to storage thereof.

Additionally, a battery voltage detection circuit 79 may optionally be included for providing a low battery voltage indication $\overline{BL}$ when the voltage of the backup battery 75 falls below a low battery threshold (e.g., 2.5 V). Thus, the electronic timer 130 will advantageously provide an indication to the user that the backup battery 75 needs to be replaced before operation of the RTC circuit 22 and tamper circuit 61 are compromised. The detection circuits 76, 78, and 79 may be implemented using comparators, for example.

A security method aspect of the invention is for determining a time of tampering with an electronic device, such as the point-of-sale device 110 or utility meter 100, for example. The method includes generating a clock reference signal and generating real time data based upon the clock reference signal, as previously discussed above. In particular, generation of the real time data includes storing respective bits of the real time data in the plurality of registers 25, where each register includes a master latch 30 for initially storing a real time data bit, a slave latch 31 for subsequently storing the real time data bit, and a user latch 32 for storing the real time data bit from the slave latch. Further, the registers 25 are incremented based upon the clock reference signal.

The method also includes holding current real time data bits in the user latches 32 based upon a tamper event signal tb indicating tampering with the electronic device, and resuming storing real time data in the user latches based upon the tamper event signal being reset. The user latches 32 thus provide user accessible real time data when the tamper event signal does not indicate a tamper event has occurred, and provide a user accessible time stamp when the tamper event signal does indicate a tamper event has occurred, as noted above. Additional method aspects of the present invention will be appreciated by those of skill in the art based upon the foregoing description and will therefore not be discussed further herein.

An exemplary embodiment of the electronic timer 130 has been implemented in a serial RTC device by STMicroelectronics, Inc., assignee of the present invention. This device has been designated part number M41T256Y and is described in an STMicroelectronics data sheet entitled "M41T256Y—256 Kbit (32K×8) Serial RTC." Further operational details and features of the invention may be found therein.

Many modifications and other embodiments of the invention will come to the mind of one skilled in the art having the benefit of the teachings presented in the foregoing descriptions and the associated drawings. Therefore, it is understood that the invention is not to be limited to the specific embodiments disclosed, and that modifications and embodiments are intended to be included within the scope of the appended claims.

That which is claimed is:

1. An electronic timer comprising;
   a clock reference signal generator for generating a clock reference signal;
   a real time clock (RTC) circuit for generating real time data based upon the clock reference signal, said RTC circuit comprising
      a plurality of registers each for storing respective bits of the real time data, each register comprising a master latch for initially storing a real time data bit, a slave latch for subsequently storing the real time data bit, and a user latch for storing the real time data bit from said slave latch, and
      a controller for causing at least some of said registers to increment based upon the clock reference signal; and
   a tamper circuit for receiving a tamper event signal and causing said user latches to hold current real time data bits based thereon until said tamper circuit is reset by a user;
   said user latches thus providing user accessible real time data when the tamper event signal does not indicate the tamper event has occurred, and providing a user accessible time stamp when the tamper event signal does indicate the tamper event has occurred.

2. The electronic timer of claim 1 wherein said electronic timer is implemented in an integrated circuit; and further comprising a package carrying said integrated circuit.

3. The electronic timer of claim 2 wherein said package has external connection terminals; and further comprising a backup battery removably connectable to said package and external connection terminals.

4. The electronic timer of claim 2 wherein said package has external connection terminals; and further comprising a crystal for cooperating with said clock reference signal generator to generate the clock reference signal, said crystal being removably connectable to said package and external connection terminals.

5. The electronic timer of claim 1 further comprising a random access memory (PAN) connected to said RTC circuit for storing real time data.

6. The electronic timer of claim 1 further comprising an interface circuit connected to said RTC circuit for allowing a user to access said user latches.

7. The electronic timer of claim 6 wherein said interface circuit allows user write access to said plurality of registers for writing initial time data therein.

8. The electronic timer of claim 1 further comprising a backup battery and a supply voltage detection circuit for selectively connecting said backup battery to said clock reference signal generator, said RTC circuit, and said tamper circuit based upon a supply voltage falling below a low supply threshold.

9. The electronic timer of claim 8 further comprising a battery voltage detection circuit for providing a low battery voltage indication when the voltage of said backup battery falls below a low battery threshold.

10. The electronic timer of claim 1 further comprising a supply voltage detection circuit for prohibiting user access to said user latches when a supply voltage falls below a low supply threshold.

11. The electronic timer of claim 1 wherein said clock reference signal generator comprises an oscillator.

12. An electronic timer comprising:
   an oscillator and a crystal cooperating therewith to generate a clock reference signal;
   a real time clock (RTC) circuit for generating real time data based upon the clock reference signal, said RTC circuit comprising
      a plurality of registers for storing respective bits of the real time data, each register comprising a master latch for initially storing a real time data bit, a slave latch for subsequently storing the real time data bit, and a nser latch for storing the real time data bit from said slave latch, and
      a controller for causing at least some of said registers to increment based upon the clock reference signal;
   a tamper circuit for receiving a tamper event signal and causing said user latches to hold current real time data bits based thereon until said tamper circuit is reset by a user;
   said user latches thus providing user accessible real time data when the tamper event signal does not indicate the tamper event has occurred, and providing a
   user accessible time stamp when the tamper event signal does indicate the tamper event has occurred; and
   a supply voltage detection circuit for prohibiting user access to said user latches when a supply voltage falls below a low supply threshold.

13. The electronic timer of claim 12 wherein said electronic timer is implemented in an integrated circuit; and further comprising a package carrying said integrated circuit.

14. The electronic timer of claim 13 wherein said package has external connection terminals; and further comprising a backup battery removably connectable to said package and external connection terminals.

15. The electronic timer of claim 13 wherein said package has external connection terminals; and wherein said crystal is removably connectable to said package and external connection terminals.

16. The electronic timer of claim 12 further comprising an interface circuit connected to said RTC circuit for allowing a user to access said user latches.

17. The electronic timer of claim 16 wherein said interface circuit allows user write access to said plurality of registers for writing initial time data therein.

18. The electronic timer of claim 12 further comprising a backup battery and a supply voltage detection circuit for selectively connecting said backup battery to said oscillator, said PIC circuit, and said tamper circuit based upon a supply voltage falling below a low supply threshold.

19. The electronic timer of claim 18 further comprising a battery voltage detection circuit for providing a low battery voltage indication when the voltage of said backup battery falls below a low battery threshold.

* * * * *

UNITED STATES PATENT AND TRADEMARK OFFICE
CERTIFICATE OF CORRECTION

PATENT NO. : 7,287,169 B2
APPLICATION NO. : 10/268871
DATED : October 23, 2007
INVENTOR(S) : Tom Youssef It is certified that error appears in the above-identified patent and that said Letters Patent is hereby corrected as shown below:

| | |
|---|---|
| Front Page, Section 52 | Delete: "EVENT STAMP"<br>Insert: --EVENT TIME STAMP-- |
| Column 3, Line 38 | Delete: "grater"<br>Insert: --greater-- |
| Column 5, Line 18 | Delete: "24gto"<br>Insert: --24g to-- |
| Column 6, Line 65 | Delete: "A"<br>Insert: --An-- |
| Column 9, Line 14 | Delete: "comprising;"<br>Insert: --comprising:-- |
| Column 9, Line 53 | Delete: "(PAN)"<br>Insert: --(RAM)-- |
| Column 10, Line 21 | Delete: "nser"<br>Insert: --user-- |

UNITED STATES PATENT AND TRADEMARK OFFICE
CERTIFICATE OF CORRECTION

PATENT NO. : 7,287,169 B2
APPLICATION NO. : 10/268871
DATED : October 23, 2007
INVENTOR(S) : Tom Youssef It is certified that error appears in the above-identified patent and that said Letters Patent is hereby corrected as shown below:

Column 10, Line 59      Delete: "Plc"
                        Insert: --RTC--

Signed and Sealed this

Sixteenth Day of December, 2008

JON W. DUDAS
*Director of the United States Patent and Trademark Office*

UNITED STATES PATENT AND TRADEMARK OFFICE
CERTIFICATE OF CORRECTION

PATENT NO. : 7,287,169 B2
APPLICATION NO. : 10/268871
DATED : October 23, 2007
INVENTOR(S) : Tom Youssef It is certified that error appears in the above-identified patent and that said Letters Patent is hereby corrected as shown below:

| | |
|---|---|
| Front Page, Section (54) and Column 1, Line 2 | Delete: "EVENT STAMP" Insert: --EVENT TIME STAMP-- |
| Column 3, Line 38 | Delete: "grater" Insert: --greater-- |
| Column 5, Line 18 | Delete: "24gto" Insert: --24g to-- |
| Column 6, Line 65 | Delete: "A" Insert: --An-- |
| Column 9, Line 14 | Delete: "comprising;" Insert: --comprising:-- |
| Column 9, Line 53 | Delete: "(PAN)" Insert: --(RAM)-- |
| Column 10, Line 21 | Delete: "nser" Insert: --user-- |

UNITED STATES PATENT AND TRADEMARK OFFICE
CERTIFICATE OF CORRECTION

PATENT NO. : 7,287,169 B2
APPLICATION NO. : 10/268871
DATED : October 23, 2007
INVENTOR(S) : Tom Youssef It is certified that error appears in the above-identified patent and that said Letters Patent is hereby corrected as shown below:

Column 10, Line 59   Delete: "Plc"
                     Insert: --RTC--

This certificate supersedes the Certificate of Correction issued December 16, 2008.

Signed and Sealed this

Thirteenth Day of January, 2009

JON W. DUDAS
*Director of the United States Patent and Trademark Office*